US 11,837,421 B2

(12) United States Patent
LaFountain et al.

(10) Patent No.: US 11,837,421 B2
(45) Date of Patent: Dec. 5, 2023

(54) SWITCH ACTUATOR ADAPTER

(71) Applicant: General Equipment and Manufacturing Company, Inc., Louisville, KY (US)

(72) Inventors: Robert L LaFountain, Scottsburg, IN (US); Michael John Simmons, Louisville, KY (US)

(73) Assignee: General Equipment and Manufacturing Company, Inc., Louisville, KY (US)

( * ) Notice: Subject to any disclaimer, the term of this patent is extended or adjusted under 35 U.S.C. 154(b) by 63 days.

(21) Appl. No.: 17/210,203

(22) Filed: Mar. 23, 2021

(65) Prior Publication Data

US 2022/0310337 A1 Sep. 29, 2022

(51) Int. Cl.
*H01H 9/00* (2006.01)
*H01H 36/00* (2006.01)
*H01H 3/12* (2006.01)
*H01H 3/04* (2006.01)

(52) U.S. Cl.
CPC .......... *H01H 36/0073* (2013.01); *H01H 3/04* (2013.01); *H01H 3/12* (2013.01)

(58) Field of Classification Search
CPC ........ H01H 36/0073; H01H 3/04; H01H 3/12; H01H 13/14; H01R 31/06
USPC ...................................................... 335/205
See application file for complete search history.

(56) References Cited

U.S. PATENT DOCUMENTS

| | | | | |
|---|---|---|---|---|
| 1,850,661 A * | 3/1932 | Crabtree | ................ | H01H 23/14 200/457 |
| 3,267,248 A * | 8/1966 | Bagley | ................... | H01H 23/14 200/330 |
| 3,604,868 A * | 9/1971 | Batcheller | ................ | H01H 3/20 200/437 |
| 4,296,394 A * | 10/1981 | Ragheb | .................... | H01H 5/02 335/206 |
| 4,771,145 A * | 9/1988 | Davis, Jr. | ............. | H01H 23/141 200/331 |
| 5,430,264 A * | 7/1995 | Shinohara | ............ | H01H 21/285 335/207 |
| 5,439,391 A * | 8/1995 | McEtchin | ............. | H01R 31/06 439/862 |

(Continued)

OTHER PUBLICATIONS

TopWorx ™ GO™ Switch, brochure, Copyright 2019 Emerson Electric Co., 24 pages.

(Continued)

*Primary Examiner* — Shawki S Ismail
*Assistant Examiner* — Lisa N Homza
(74) *Attorney, Agent, or Firm* — Quarles & Brady LLP

(57) ABSTRACT

A switch assembly for adapting a non-contact switch into a contact triggered switch, such that the internal electrical state of the non-contact switch can be triggered by mechanical contact with an object or surface. The switch assembly can include an adapter body coupled to the non-contact switch and an actuation body coupled to the adapter body. The actuation body can be movable relative to the adapter body to selectively position a target supported by the actuation body within a sensing region of the non-contact switch. The actuation body can be moved by an external object making contact with a portion of the actuation body.

9 Claims, 8 Drawing Sheets

(56) References Cited

U.S. PATENT DOCUMENTS

| | | | | |
|---|---|---|---|---|
| 5,464,953 | A * | 11/1995 | Kim | H01H 43/028 200/38 FA |
| 5,646,587 | A * | 7/1997 | Miyazawa | H03K 17/97 335/207 |
| 6,329,893 | B1 * | 12/2001 | Furukawa | B60R 22/48 335/207 |
| 6,670,873 | B2 * | 12/2003 | Inada | H03K 17/97 200/314 |
| 7,034,644 | B2 * | 4/2006 | Moldovan | H01H 71/04 335/205 |
| 7,352,174 | B1 * | 4/2008 | Lee | G01D 5/25 335/206 |
| 8,643,220 | B1 * | 2/2014 | Bhosale | H01H 21/36 307/115 |
| 2002/0137393 | A1 * | 9/2002 | Herring | H01R 31/06 439/628 |
| 2003/0001705 | A1 * | 1/2003 | Sugiyama | B60Q 1/1476 335/205 |
| 2003/0030522 | A1 * | 2/2003 | Kasashima | H03K 17/97 335/205 |
| 2005/0134214 | A1 * | 6/2005 | Geiger | B60R 11/02 320/111 |
| 2015/0091679 | A1 * | 4/2015 | Bachmann | H03K 17/9517 335/205 |
| 2017/0256899 | A1 * | 9/2017 | Mitchell | H01R 13/53 |
| 2018/0275351 | A1 * | 9/2018 | Parikh | G02B 6/3888 |
| 2019/0371541 | A1 * | 12/2019 | Riepe | H01H 9/283 |
| 2021/0057171 | A1 * | 2/2021 | LaFountain | H01H 11/04 |
| 2022/0181094 | A1 * | 6/2022 | Ku | H01H 9/02 |

OTHER PUBLICATIONS

Honeywell Heavy-Duty Limit Switches, screenshot product switches, Copyright 2021 Honeywell International Inc., 2 pages.
OMRON Industrial Automation Limit Switches, screenshot product switches, Copyright OMRON Corporation 2007-2021, 1 page.

* cited by examiner

SWITCH ACTUATOR ADAPTER

CROSS REFERENCE TO RELATED APPLICATIONS

Not applicable.

BACKGROUND

Contact switches typically rely upon the contact of a target (e.g., a moving surface) with another component to provide the force and displacement necessary to cause the contact switch to change state. Non-contact switches are typically caused to change state based on proximity of another component to the switches, without requiring mechanical contact.

SUMMARY

According to one aspect of the present disclosure, a switch assembly for detecting a state of a system is provided. The switch assembly includes an enclosed housing that encloses a magnetic assembly. The magnetic assembly is configured to be selectively activated to move the switch assembly between a first state and a second state. The switch assembly additionally includes an adapter body that is secured to the enclosed housing, external to the enclosed housing, and an actuation body that is movably supported by the adapter body and supports a target external to the enclosed housing. The target is at least one of a magnetic target or a ferrous target. The actuation body is movable relative to the adapter body and the enclosed housing, between a first orientation and second orientation, to move the target, respectively, between a first location in which the target activates the magnetic assembly and a second location in which the target does not activate the magnetic assembly.

Some aspects provide an adapter system for a switch assembly, to convert the switch assembly from a non-contact switch assembly to a contact switch assembly. The adapter system includes an adapter body configured to be secured to an enclosed housing of the switch assembly, external to the enclosed housing, an actuation body connected to and supported by the adapter body, and a target connected to the actuation body and configured to be supported external to the enclosed housing by the actuation body, via the adapter body. The actuation body is movable relative to the adapter body between a first orientation and second orientation, to move the target, respectively, between a first location in which the target is oriented to activate the switch assembly from outside the enclosed housing and a second location in which the target is oriented to not activate the switch assembly.

Some aspects provide a method of converting a switch assembly from a non-contact switch assembly to a contact switch assembly to detect an event. The method includes securing an adapter body to an enclosed housing of the switch assembly, external to the enclosed housing, with an actuation body connected to the adapter body, so that a target connected to the actuation body is supported externally to the enclosed housing by the adapter body and by the actuation body. The method also includes disposing the actuation body to be moved relative to the adapter body, upon occurrence of the event, from a first orientation to second orientation, to thereby move the target from a first location to a second location, the target being configured to activate the switch assembly from outside the enclosed housing when oriented in at least one of the first or second locations.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
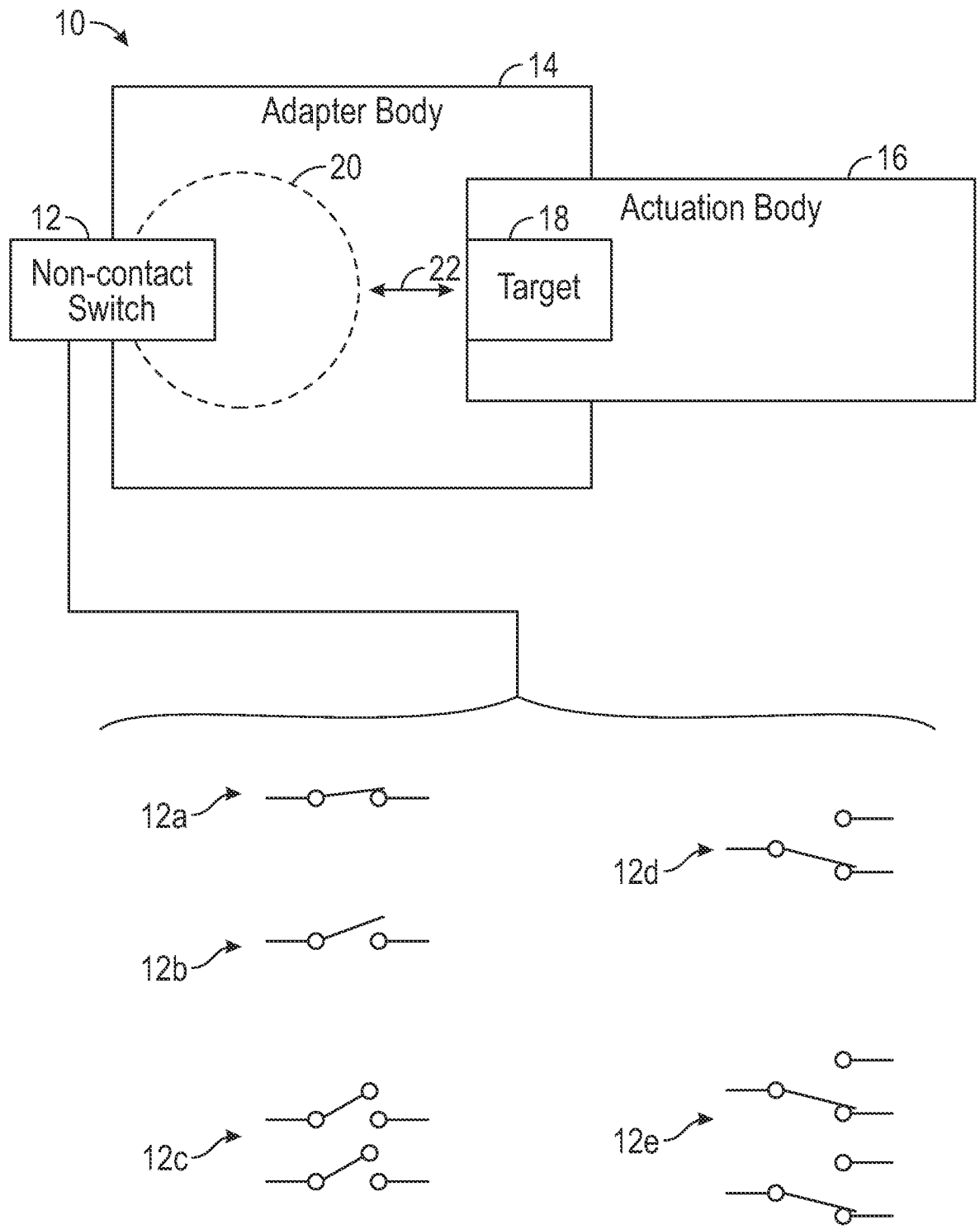
FIG. 1 is a schematic illustration of a switch assembly for converting a non-contact switch to a contact switch.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the attached drawings. The invention is capable of other embodiments and of being practiced or of being carried out in various ways. Also, it is to be understood that the phraseology and terminology used herein is for the purpose of description and should not be regarded as limiting. For example, the use of "including," "comprising," or "having" and variations thereof herein is meant to encompass the items listed thereafter and equivalents thereof as well as additional items.

As used herein, unless otherwise specified or limited, the terms "mounted," "connected," "supported," "secured," and "coupled" and variations thereof, as used with reference to physical connections, are used broadly and encompass both direct and indirect mountings, connections, supports, and couplings. Further, unless otherwise specified or limited, "connected," "attached," or "coupled" are not restricted to physical or mechanical connections, attachments or couplings.

As briefly noted above, contact switches (e.g., limit switches) traditionally rely upon the contact with a target (e.g., a movable surface) to provide the force and displacement necessary to cause the contact switch to change state. Generally, conventional contact switches have ingress points through which a portion of the switch extends to change the state of the switch based upon mechanical contact with another body that is external to the switch (e.g., a body of a system that is being monitored by the switch). Thus, to provide a sealed housing for contact switches, movable sealing arrangements must often be provided, which can be subject to degradation and failure over time.

In contrast, non-contact switches do not require contact with a target (e.g., a magnet or ferrous material) to cause the non-contact switch to change states. Correspondingly, a change of state of a system to be monitored by a non-contact switch can cause a corresponding change of state of a non-contact switch without requiring ingress points into the switch. Thus, for example, non-contact switches may be particularly favorable for environments with hazardous gases, which are preferably not exposed to electronic devices or other potential spark points. However, because non-contact switches may rely on changes in non-mechanical fields to cause changes in state for the switches, the range of non-contact switches may sometimes be relatively small. Similarly, an area over which a non-contact switch may detect changes in a state of a monitored system may also sometimes be relatively small.

In this view, it may be useful to provide improved switches and related systems and methods that can combine the benefits of non-contact and contact switches, including in new installations and for retrofit of existing installations. As will be described herein, the present disclosure provides systems and methods for adapting a non-contact switch into a mechanically triggered switch, such that the non-contact switch can be triggered (i.e., the internal electrical state of the non-contact switch can be changed) by mechanical contact with an external object or surface.

In some embodiments, an adapter body can be provided that is configured to be secured to a housing of a non-contact switch. For example, an adapter body that supports an actuation body can be configured to be threadably or otherwise mechanically attached to a housing of a non-contact switch (e.g., strapped thereto) without requiring ingress of any part of the adapter body or the actuation body extends through a wall of the non-contact switch housing. The actuation body, which can be formed as a lever, a button, or according to other known types of mechanically movable interfaces, can support a target that is configured to trigger the non-contact switch, without entering the housing of the non-contact switch, depending on the spatial orientation of the actuation body relative to the adapter body. Thus, for example, mechanical contact or other physical interactions with the actuation body, fully external to the housing of the non-contact switch, can move the target to trigger (or not-trigger) the non-contact switch.

FIG. 1 illustrates an example schematic of a switch assembly 10 for detecting a state of a system, according to some embodiments of this disclosure. In the embodiment illustrated, the switch assembly 10 includes a non-contact switch 12, an adapter body 14, and an actuation body 16. According to some embodiments, the actuation body 16 can be configured as a lever arm, a push-button, a latch, a rod, a linkage, a roller, or other mechanical arrangements that are movable relative to the adapter body 14. According to some embodiments, a contact roller (not shown in FIG. 1) can be arranged on the actuation body 16 (e.g., on an end of a lever arm or push-button), as may provide a useful contact surface with a system to be monitored.

Continuing, the actuation body 16 includes a target 18 that is configured to trigger the non-contact switch 12. In some embodiments, the target 18 can be at least one of a magnetic target or a ferrous target, although other configurations are also possible. Generally, the switch assembly 10 can be configured to be selectively actuated between a first state and a second state (or otherwise) based upon the non-contact switch 12 sensing (or not sensing) the target 18 within a sensing region 20. In the illustrated example, the sensing region 20 is shown as having a generally circular profile. However, differently configured sensing regions are possible, depending on the specific configuration of the non-contact switch 12.

In different embodiments, different specific configurations of the non-contact switch 12 are possible, depending on the sensing and environmental constraints of a particular installation. For example, according to some embodiments, the non-contact switch 12 can be a magnetic switch or other type of proximity sensor, or another known type of switch that does not require contact with an external body to be triggered by a corresponding target. The internal configuration of the non-contact switch 12 relative to a system to be controlled by the switch 12 can also vary, depending on the needs of a particular installation. For example, according to some embodiments, the non-contact switch 12 can include circuits for a single pole double throw switch ("SPDT") (e.g., as shown at partial circuit 12d), a double pole double throw ("DPDT") switch (e.g., as shown at partial circuit 12e), a single pole single throw ("SPST") switch (e.g., as shown at partial circuits 12a, 12b), or a double pole single throw ("DPST") switch (e.g., as shown at partial circuit 12c). In some cases, the non-contact switch 12 can be configured as a "passive" switch. That is, the non-contact switch 12 can consume no power to operate. In some embodiments, a switch can additionally or alternatively include circuits or other devices for any variety of known switches, including double make double break switches, magnetic or inductive switches (e.g., reed switches), capacitive switches, or mechanical switches.

To allow the target 18 to trigger the non-contact switch 12, the non-contact switch 12 and the actuation body 16 can be coupled to the adapter body 14. In some cases, the actuation body 16 can be directly secured to the non-contact switch 12, so that the actuation body 16 and the non-contact switch 12 are combined into a single, connected, collectively movable system. Further, the actuation body 16 can be movably supported by the adapter body 14 such that the actuation body 16 can be movable relative to the adapter body 14 between a first orientation and a second orientation (as generally illustrated by arrow 22, which generally indicates any type of movement of the actuation body 16, including translation, rotation, or a combination of the two). As will be described below, when the actuation body 16 is moved into one of the first orientation or the second orientation, the target 18 can thereby be placed in a location within the sensing region 20 of the non-contact switch 12 to activate the non-contact switch into one of the first state or the second state. Further, as appropriate for the desired application, another orientation of the actuation body 16 can place the target 18 outside the sensing region 20.

Figure 2:
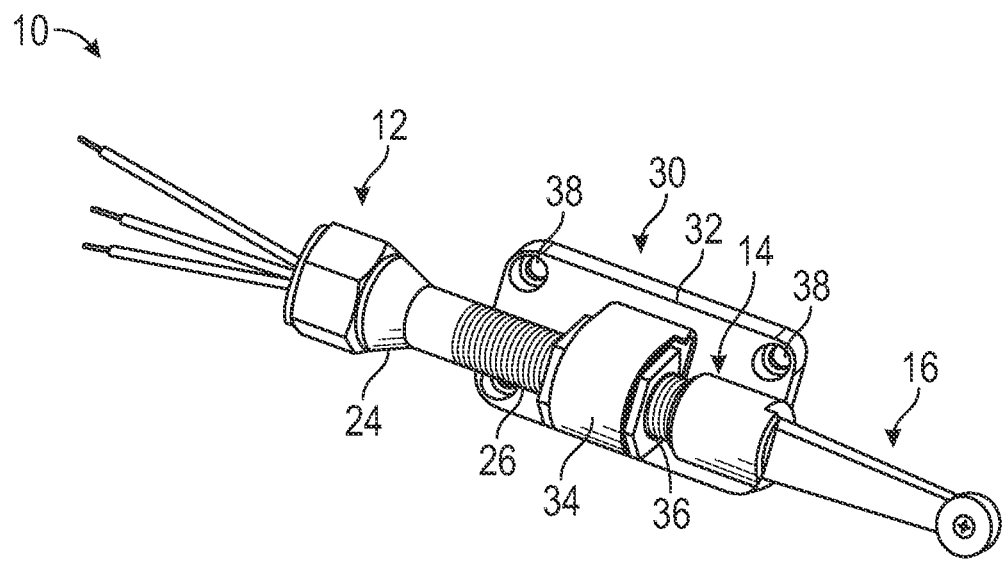
FIG. 2 is a perspective view of a switch assembly including a non-contact switch converted for use as a contact switch with a lever arm actuation body.
Figure 3:
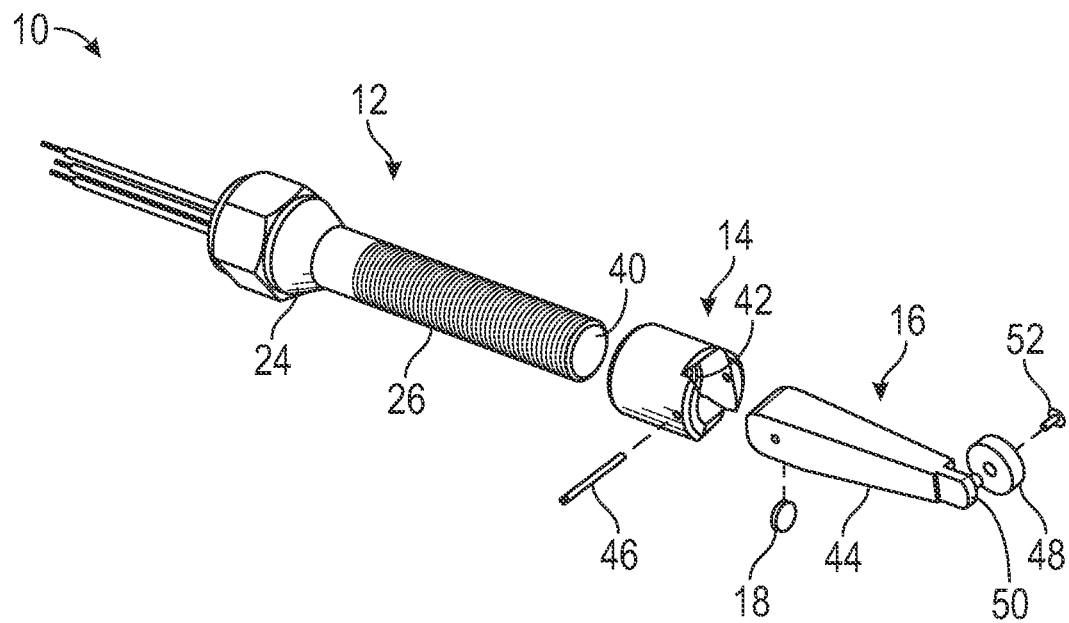
FIG. 3 is an exploded view of the switch assembly of FIG. 2.
Figure 4:
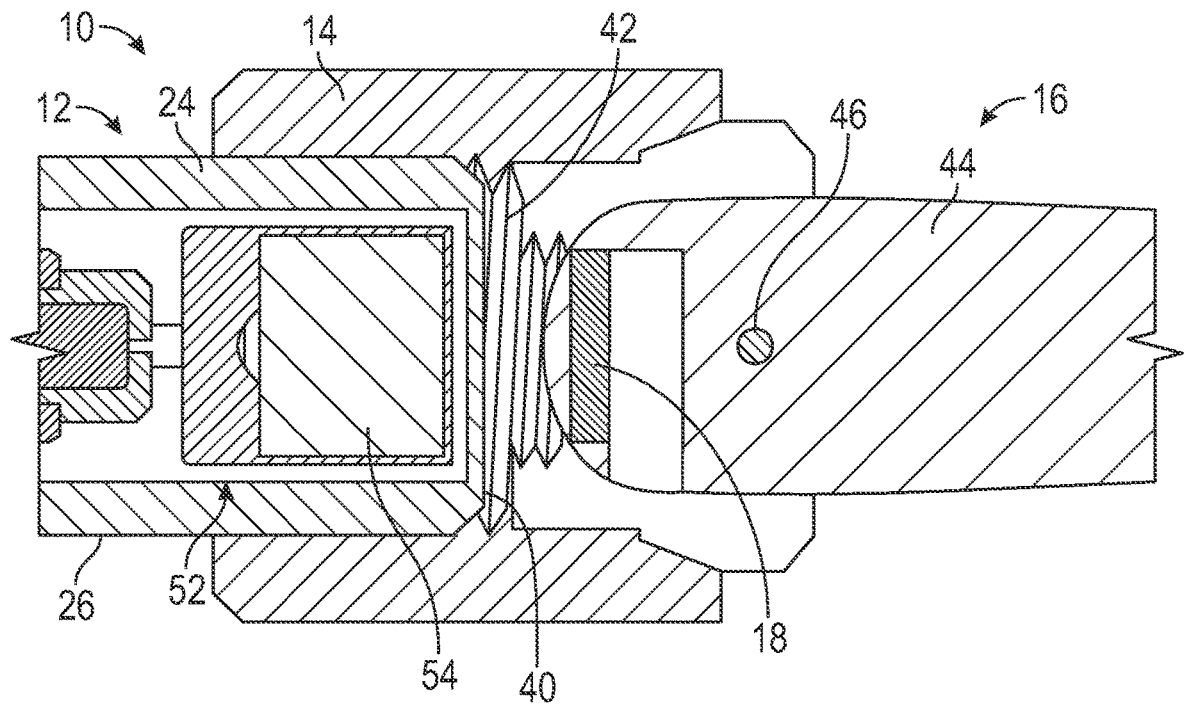
FIG. 4 is a cross-section view of the switch assembly of FIG. 2 with the switch assembly in a first state.
Figure 5:
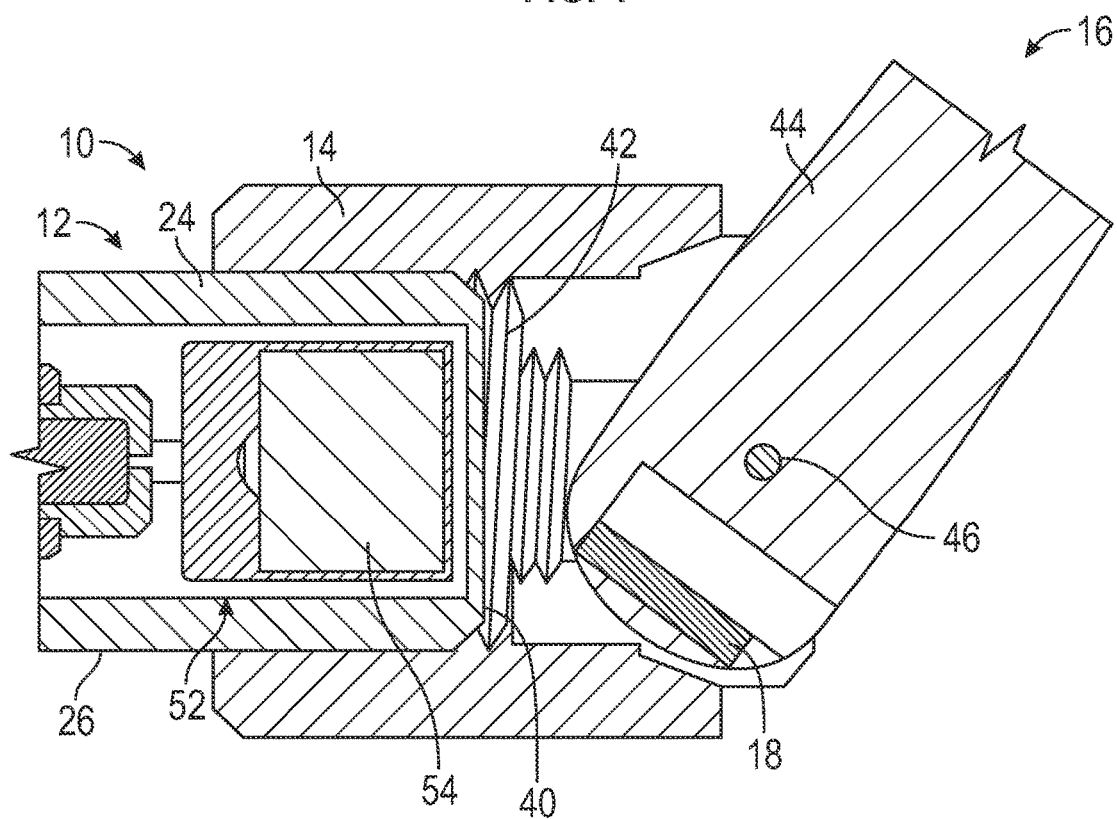
FIG. 5 is a cross-section view of the switch assembly of FIG. 2 with the switch assembly in a second state.

Referring now to FIGS. 2 and 3, a first embodiment of a switch assembly 10 is illustrated. The switch assembly 10 includes an adapter body 14 directly secured to a housing 24 of the non-contact switch 12. The housing 24, as will be further described relative to FIGS. 4 and 5, is configured to enclose a magnetic assembly to trigger the non-contact switch 12 depending on external conditions. In particular, the housing 24 as illustrated in FIGS. 2 and 3 includes a round housing profile (i.e., having a circular cross-section). In other embodiments, the housing 24 can include a square housing profile (see FIG. 9). In the illustrated embodiment of FIGS. 2 and 3, the housing 24 also includes a threaded portion 26 along at least a portion of the length of the housing 24. In the illustrated embodiment of FIGS. 2 and 3, the threaded portion 26 is arranged along the round profile section of the housing 24, near one end of the housing 24.

Still referring to FIGS. 2 and 3, in the illustrated embodiment, the switch assembly 10 includes a base 30 that includes a mounting plate 32 secured to the housing 24. Generally, the base 30 can be configured to secure the switch assembly 10 to a surface to support the switch assembly 10 during activation/actuation. In particular, as shown in FIGS. 2 and 3, the base 30 includes a strap 34 coupled to the mounting plate 32. As shown, the strap 34 is integrally formed with the mounting plate 32, although other configurations are possible, including configurations in which the strap 34 (or other straps) are not associated with a separate mounting plate.

In the embodiment of FIGS. 2 and 3, the strap 34 defines an opening 36 extending through the strap 34. The opening 36 defines a shape corresponding to the profile of the housing 24 (e.g., a round profile, etc.). The strap 34 also includes a threaded portion on an interior surface configured to threadably engage the threaded portion 26 of the housing 24. The threaded engagement between the base 30 and the housing 24 of the non-contact switch 12 can provide a precise positioning of the housing 24 relative to the base 30 in some cases, although other configurations are also possible. This precise positioning can provide accurate adjustment of the switch assembly 10 once installed into a system.

The mounting plate 32 can also include one or more fastener apertures 38 configured to receive a fastener (not shown) therein. The fasteners (e.g., rivets, bolts, screws, etc.) can be utilized to secure the base 30, and thereby the switch assembly 10, to a surface or system where state detection is desired (i.e., such as the position of a door or latch). In other embodiments, other configurations are also possible. Generally, any variety of mounting systems can be used to secure a non-contact switch for use in a particular location, as part of a switch assembly according to this disclosure.

As best illustrated in FIG. 3, the adapter body 14 is external to the housing 24 and can be coupled to a distal end 40 of the housing 24. In the illustrated embodiment, the adapter body 14 is configured as a cylindrical sleeve including provisions for coupling with the actuation body 16 and the housing 24. For example, the adapter body 14 can be secured to the housing 24 at a portion where the housing 24 defines a round profile. In the illustrated embodiment of FIGS. 2 and 3, in particular, the adapter body 14 can be threadably engaged with the housing 24. For example, the adapter body 14 defines an annular shape and includes a threaded interior surface 42. The threaded interior surface 42 can be configured to threadably engage the threaded portion 26 of the housing 24. Thus, for example, the threaded interior surface 42 can provide a precise positioning of the actuation body 16, including the target 18, relative to the housing 24. This precise position can provide accurate adjustment of the target 18 relative to the sensing region 20 (see FIG. 1) of the non-contact switch 12, including when used in combination with a threaded strap engagement with the base 30, as discussed above.

In the illustrated embodiment of FIGS. 2 and 3, the actuation body 16 includes a target 18, a lever arm 44, and a roller 48, although other configurations to support a target can be used in other cases. For the embodiment of FIGS. 2 and 3, the lever arm 44 can be pivotally coupled to the adapter body 14 to allow the target 18 to be moved between orientations. For example, the lever arm 44 can be pivotally coupled to the adapter body 14 via a pivot pin 46 and the target 18 can be coupled to the lever arm 44 proximate the pivotal coupling. Thus, when the lever arm 44 is rotated, a positioning of the target 18 is also changed. In the illustrated embodiment, the pivot pin 46 is configured to extend through the adapter body 14 and the lever arm 44 to pivotally secure the lever arm 44 to the adapter body 14, although a variety of other pivoting arrangements are possible (e.g., with integrally formed pivot pins, etc.).

In the embodiment of FIGS. 2 and 3, the roller 48 is coupled to a distal end 50 of the lever arm 44. Thus, the roller 48 can be readily disposed to engage a surface of a system to be monitored at a maximum distance provided by the lever arm 44, to allow actuation of the lever arm 44. In other embodiments, a roller can be differently located or configured, and some embodiments may not employ a roller for this purpose.

Referring now to FIGS. 4 and 5, a cross section of the switch assembly 10 of FIGS. 2 and 3 is illustrated. As shown, in this embodiment, the non-contact switch 12 includes a magnetic assembly 52 enclosed within the housing 24. The magnetic assembly 52 is configured to be selectively activated to move the switch assembly between a first state (FIG. 4) and a second state (FIG. 5), although other internal switch configurations are possible, as generally discussed above.

As illustrated in FIGS. 4 and 5, the lever arm 44 of the actuation body 16 can be pivoted relative to the adapter body 14 and the enclosed housing 24, between a first orientation (FIG. 4) and second orientation (FIG. 5), to move the target 18, respectively, between a first location in which the target 18 activates the magnetic assembly and a second location in which the target 18 does not activate the magnetic assembly. For example, with the switch assembly 10 in the first state as shown in FIG. 4, the lever arm 44 can be positioned in the first orientation to position the target 18 into the first location (e.g., within the sensing region of the non-contact switch 12). With the target 18 within the sensing region, the magnetic assembly 52 is activated by way of a magnet 54 included in the magnetic assembly 52 shifting within the housing 24 due to the magnetic attraction between the magnet 54 and the target 18.

Continuing relative to FIGS. 4 and 5, the switch assembly 10 may transition from the first state (FIG. 4) towards the second state (FIG. 5) upon contact between an external object (e.g., a surface of a moving object) and a portion of the actuation body 16 (e.g., the lever arm 44 or roller 48). The contact from the external object can cause the actuation body 16 to move relative to the adapter body 14 from the first orientation (FIG. 4) towards the second orientation (FIG. 5). When the switch assembly 10 is in the second state (FIG. 5), the lever arm 44 is pivoted to a second orientation such that the target 18 is in the second location (e.g., positioned away from the sensing region of the non-contact switch 12). With the target 18 positioned away from the sensing region of the non-contact switch 12, the magnet 54 in the magnetic assembly 52 shifts to a non-activated state (e.g., where the target 18 does not activate the magnetic assembly 52).

In the illustrated embodiment, the magnet 54 of the magnetic assembly moves axially within the housing 24, dependent upon a magnetic attraction between the target 18 and the magnet 54, to selectively activate the non-contact switch 12. In other embodiments, non-axial movement of a magnetic assembly may be possible. Further, in some embodiments, a magnetic assembly of a non-contact switch may be repelled by a target, with corresponding changes to the response of the magnetic assembly to the position of the target.

In the illustrated embodiment, the housing 24 completely encloses the magnetic assembly 52, with the adapter body 14, the actuation body 16, and the target 18 disposed completely external to the enclosed housing 24. The housing 24 can thus be a sealed housing without ingress point for activation of the magnetic assembly 52. That is, the non-contact nature of the non-contact switch enables the magnetic assembly 52 to be selectively actuated without a mechanical member or structure extending into the enclosed interior housing to shift the magnet 54 of the magnetic assembly (or otherwise change the state of the non-contact switch 12). Correspondingly, the magnetic assembly 52 is configured to be selectively actuated by the external target 18 without contact between the magnetic assembly 52 and the target 18, or even, without contact between the housing 24 and the target 18. As generally noted above, the lack of ingress points can be beneficial, including so as to provide a housing 24 that can be configured as an explosion-proof housing. For example, the enclosed housing 24 provides a sealed internal chamber preventing moisture, dust, dirt, caustics, corrosives, or chemicals from reaching the magnetic assembly 52 or other internal components (e.g., electrical circuits with potential to produce sparks).

According to some embodiments, a biasing element can be arranged between the adapter body 14 and the actuation body 16, so that the actuation body is biased toward a particular orientation. For example, a torsion spring (not shown), coil spring (not shown), elastomer element (not shown) or other known biasing element can be arranged between the lever arm 44 and the adapter body 14 in the configuration shown in FIGS. 4 and 5 (or in a similar location for other embodiments). Thus, the biasing element can be configured to bias the lever arm 44 into one of the first orientation or the second orientation. According to some embodiments, a spring-effect can be provided by the magnetic repulsion or attraction between the target 18 and the magnet 54 within the magnetic assembly 52, rather than (or in addition to) by a separate spring or other biasing element. According to other embodiments, an additional magnet can be arranged on the actuation body 16. The additional magnet can be configured to bias the actuation body 16 into one of the first orientation or the second orientation.

In some embodiments, the switch assembly 10 can be normally in one of the first state or the second state. For example, the arrangement of a biasing element can bias the lever arm 44 into one of the first orientation or the second orientation shown in FIGS. 4 and 5. Additionally or alternatively, the target 18 can be repositioned on the lever arm 44 such that the target 18 is aligned with the magnet 54 of the magnetic assembly 52 when the lever arm 44 is in the second orientation (i.e., the orientation illustrated in FIG. 5). In that way, the arrangement of the target 18 on the lever arm 44 can determine if the magnetic assembly is normally activated by the target 18. For example, in the embodiment illustrated in FIG. 4, the switch assembly 10 is in a normally activated state. That is, the actuation body 16 can be biased into the illustrated orientation, aligning the target 18 with the magnet 54 of the magnetic assembly 52, thereby providing a switch state where the magnetic assembly is normally active.

Figure 6:
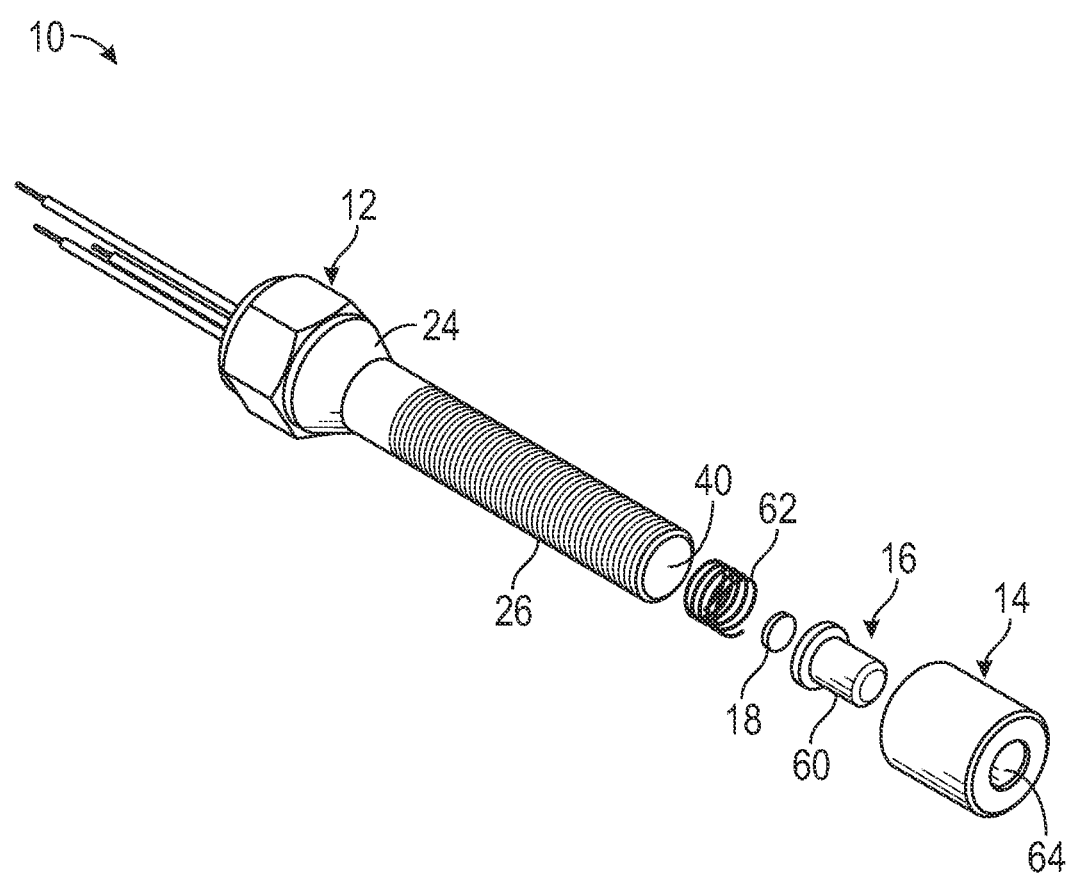
FIG. 6 is an exploded view of a switch assembly including a non-contact switch converted for use as a contact switch with a push-button actuation body.

Referring now to FIG. 6, a second embodiment of a switch assembly 10 is illustrated. In the following figures, like elements will be identified with like reference numerals. For example, the switch assembly 10 of FIG. 6 includes an adapter body 14 directly secured to a housing 24 of the non-contact switch 12, and an actuation body 16 can be movably supported by the adapter body 14 such that the actuation body 16 can be movable relative to the adapter body 14 between a first orientation and a second orientation. In the illustrated embodiment, the actuation body 16 includes a push-button 60 slidably arranged in the adapter body. The push-button 60 supports a target 18 that is moveable therewith. The switch assembly 10 also includes a biasing element 62 arranged between the housing 24 of the non-contact switch 12 and the push-button 60. In the illustrated embodiment, the biasing element 62 is a mechanical coil spring. According to other embodiments, the biasing element can be a magnet or a different type of spring. For example, a ring magnet can be coupled to the push-button that can oppose the magnet within the magnetic assembly, thereby providing a spring-effect. As detailed below, the biasing element 62 can be configured to bias the actuation body 16 towards one of a first or second orientation.

In the illustrated embodiment of FIG. 6, the adapter body 14 is configured as a cylindrical sleeve including provisions for coupling with the actuation body 16 and the housing 24. For example, the adapter body 14 can be threadably engaged with the housing 24 via a threaded interior surface 42. The threaded interior surface 42 can be configured to threadably engage the threaded portion 26 of the housing 24. The actuation body 16 can also define a bore 64 configured to slidably receive the push-button 60 therein.

Figure 7:
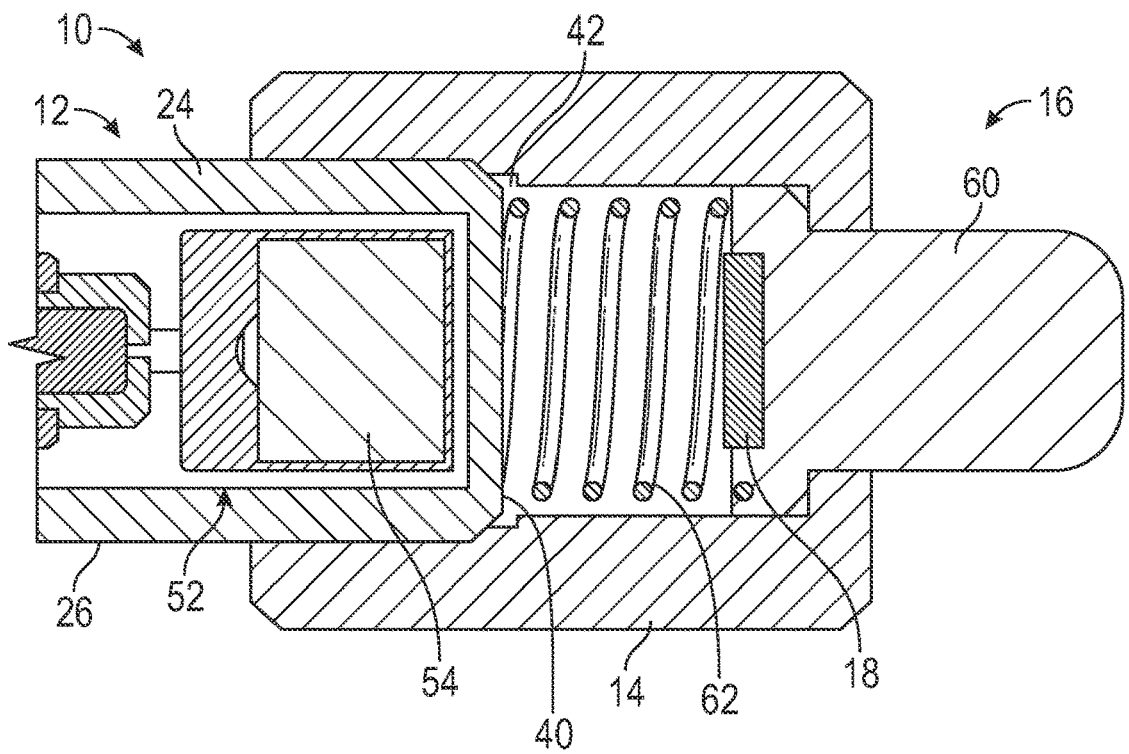
FIG. 7 is a cross-section view of the switch assembly of FIG. 6 with the switch assembly in a first state.
Figure 8:
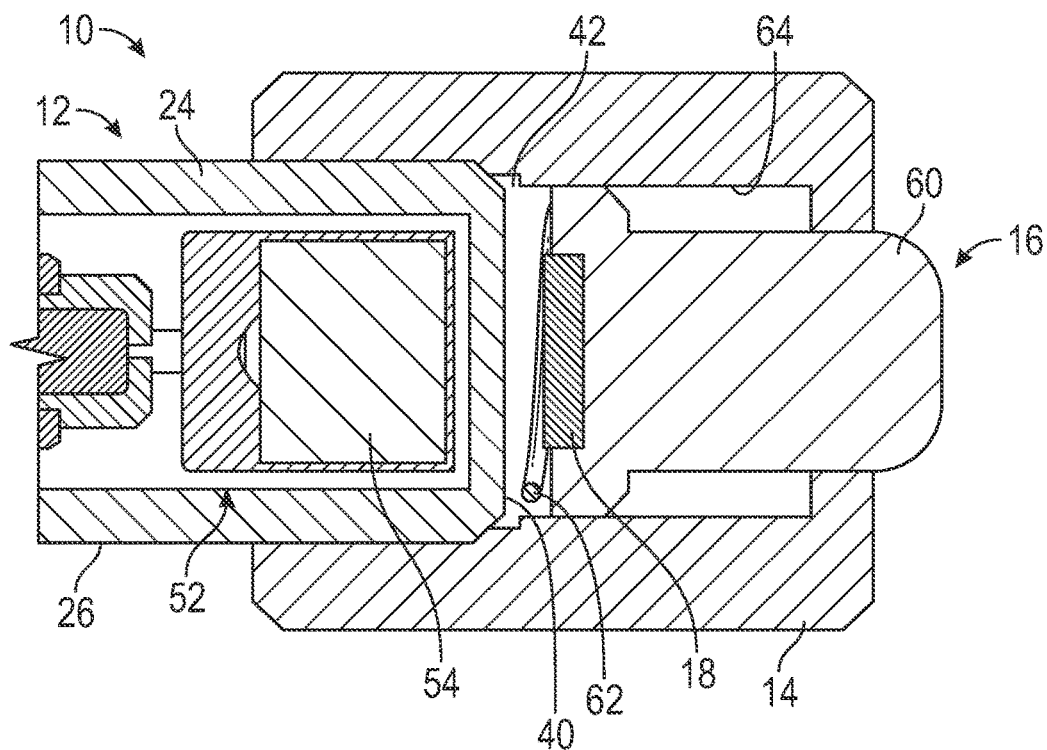
FIG. 8 is a cross-section view of the switch assembly of FIG. 6 with the switch assembly in a second state.

Referring now to FIGS. 7 and 8, a cross section of the switch assembly 10 of FIG. 6 is illustrated. As shown, the non-contact switch 12 includes a magnetic assembly 52 enclosed within the housing 24. The magnetic assembly 52 is configured to be selectively activated to move the switch assembly 10 between a first state (FIG. 7) and a second state (FIG. 8). In the illustrated embodiment, the push-button 60 of the actuation body 16 can be axially shifted relative to the adapter body 14 and the enclosed housing 24, between a first orientation (FIG. 7) and second orientation (FIG. 8), to move the target 18, respectively, between a first location and a second location. For example, with the switch assembly 10 in the first state (FIG. 7), the push-button 60 can be positioned in the first orientation to position the target 18 in the first location (e.g., not within the sensing region of the non-contact switch 12). With the target 18 away from the sensing region, the magnetic assembly 52 is not activated (e.g., not in an active state). With the switch assembly 10 in the first state, the biasing element 62, in this case, a coil spring, biases the push-button 60 of the actuation body 16 into the first orientation (FIG. 7), thereby positioning the target 18 supported by the actuation body 16 into a first location.

The switch assembly 10 may then transition from the first state towards the second state upon contact between an external object (e.g., a surface) and a portion of the actuation body 16 (e.g., the push-button 60). The contact from the external object can cause the actuation body 16 to move relative to the adapter body 14 from the first orientation (FIG. 7) towards the second orientation (FIG. 8). When the switch assembly 10 is in the second state (FIG. 8), the push-button 60 is translated to a second orientation such that the target 18 is in a second location (e.g., positioned within the sensing region of the non-contact switch 12). With the target 18 positioned within the sensing region of the non-contact switch 12, the magnet 54 in the magnetic assembly 52 shifts to an activated state. In the illustrated embodiment, the magnet 54 of the magnetic assembly moves axially within the housing 24 dependent upon a magnetic attraction between the target 18 and the magnet 54. This axial shifting of the magnet 54 selectively activates the non-contact switch 12. (As also noted above, other types of internal assemblies for a non-contact switch are also possible, including as may be used with a push-button actuation body.)

As previously described herein, the switch assembly 10 can be normally in one of the first state or the second state. For example, the arrangement of the biasing element can bias the push-button 60 into one of the first orientation or the second orientation. For example, in the embodiment illustrated in FIG. 7, the switch assembly 10 is in a normally non-activated state. That is, the actuation body 16 can be biased into the illustrated orientation, displacing the target 18 away from the magnet 54 of the magnetic assembly 52, thereby providing a switch state where the magnetic assembly is normally non-activated. In other embodiments, however, a reversed configuration is also possible.

Figure 9:
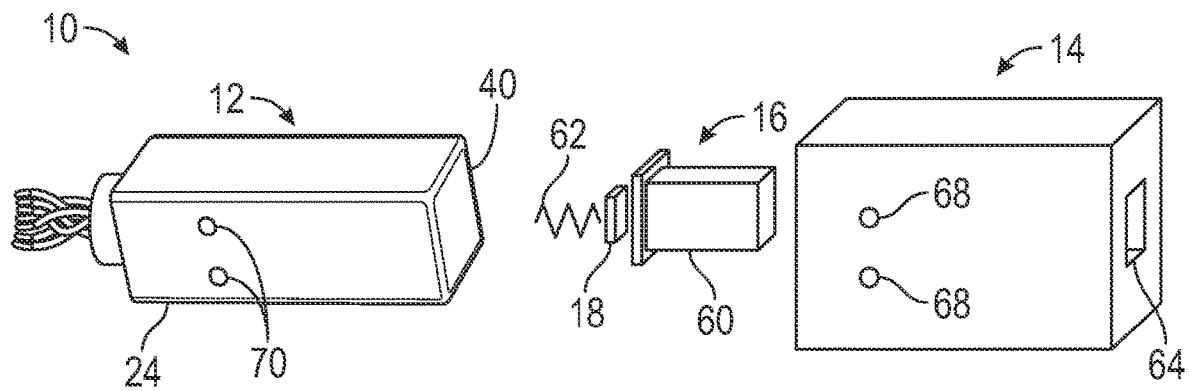
FIG. 9 is an exploded view of a switch assembly including a non-contact switch having a square profile.

Referring now to FIG. 9, a third embodiment of a switch assembly 10 is illustrated. In the illustrated embodiment, the actuation body 16 is configured as a push-button 60, although other actuation body configurations are also possible, including a lever arm (e.g., previously described relative to FIGS. 2 through 5). In the illustrated embodiment of FIG. 9, the housing 24 includes a square (or other rectangular) housing profile. Correspondingly, the adapter body 14 can be secured to the housing 24 at a portion where the housing 24 defines a square profile. In the illustrated embodiment, the adapter body 14 can include an opening (not shown) configured to receive the housing 24 such that the adapter body 14 can be positioned around the housing 24. According to some embodiments, the adapter body 14 can provide an interference fit between the housing 24 and the adapter body 14 to secure the adapter body 14 to the housing 24. In other embodiments, the adapter body 14 can provide a slip fit. In some embodiments, the adapter body 14 can be formed as or generally include a strap (e.g., as also discussed above). In the illustrated embodiment of FIG. 9, the adapter body 14 includes apertures 68 configured to align with housing apertures 70 such that, when the adapter body 14 is installed onto the housing 24, fasteners can be inserted through the apertures 68 and the housing apertures 70 to secure the adapter body 14 to the housing 24.

In the embodiment of FIG. 9, the push-button 60 exhibits a rectangular profile and a bore 64 in the actuation body 16 that slidably receives the push-button 60 is also rectangular. In other embodiments, other shapes of push-button are possible. Similarly, in some embodiments, a rectangular profile for a switch housing or for an adapter body can be implemented in combination with other types of actuation bodies, including levers (e.g., as discussed above).

Figure 10:
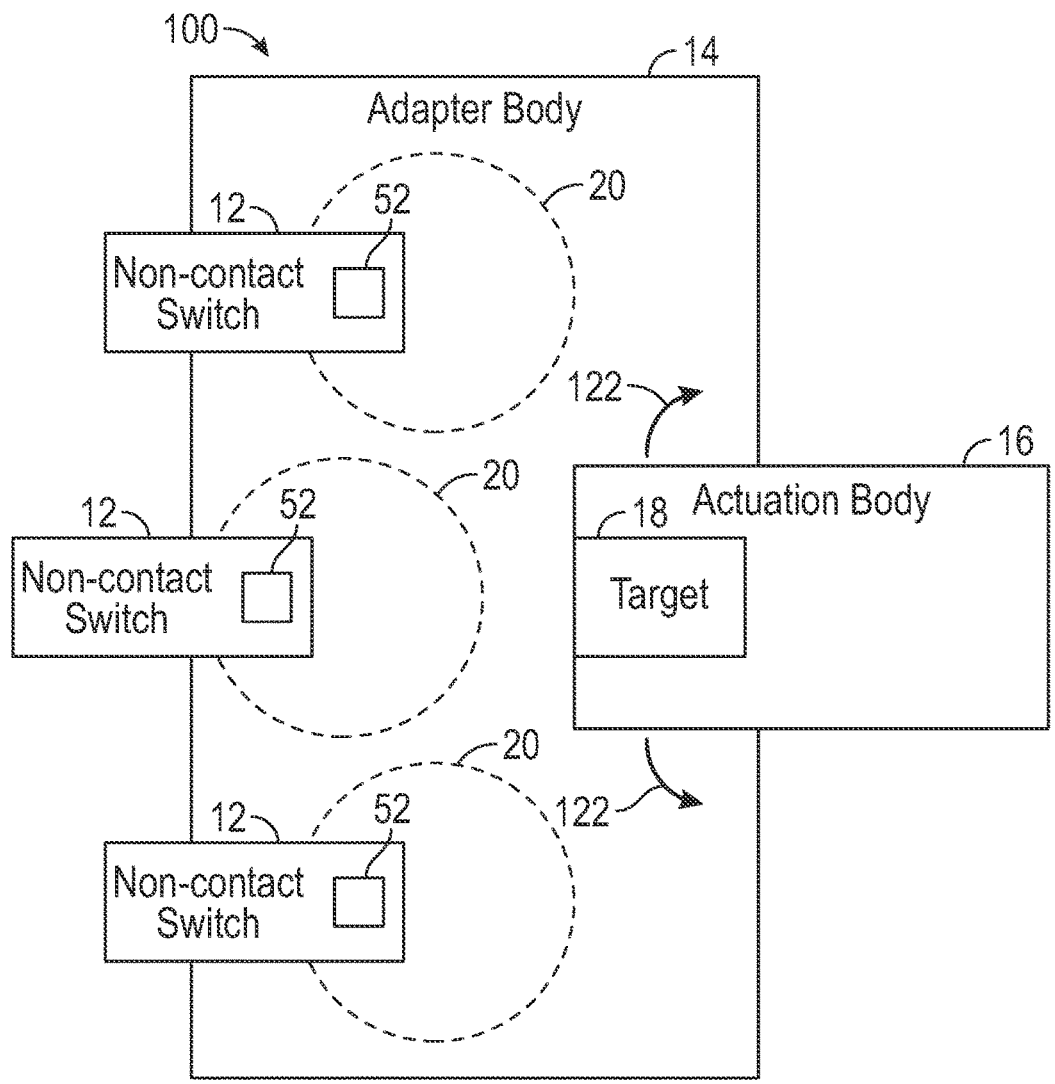
FIG. 10 is a schematic illustration of a switch assembly including a plurality of non-contact switches.

As generally noted above, some embodiments can include a plurality of switches (e.g., with a corresponding plurality of separate housings) that can be activated by one or more actuation bodies. For example, FIG. 10 illustrates a switch assembly 100 including a plurality of non-contact switches 12 coupled to and supported by an adapter body 14. The switch assembly 100 also includes an actuation body 16 that supports a target 18 and is movable relative to the adapter body 14, as generally illustrated by arrows 122. It is to be understood that, although arrows 122 indicate pivotal or rotational motion, that the actuation body 16 can also (or alternatively) be translated in some embodiments. Thus, the actuation body 16 can generally be moved relative to the adapter body 14 in order to selectively activate one or more of the non-contact switches 12, including individually or collectively (in various combinations), depending on the configuration of a particular installation.

In some examples, including as illustrated in FIG. 10, each of the plurality of non-contact switches 12 can enclose a magnetic assembly 52 configured to be selectively activated by the target 18. Correspondingly, with a ferrous or magnetic configuration for the target 18, the actuation body 16 can be movable relative to the plurality of non-contact switches 12 to selectively actuate one or more of the non-contact switches 12. For example, in the illustrated embodiment, the switch assembly 100 can be configured to detect the target 18 at a plurality of distinct locations as the actuation body 16 is moved. In that way, a plurality of positions of the actuation body 16, as may correspond to a plurality of positions of an external object in contact with the actuation body 16, can be determined dependent upon which of the plurality of non-contact switches 12 are in an activated state.

Figure 11:
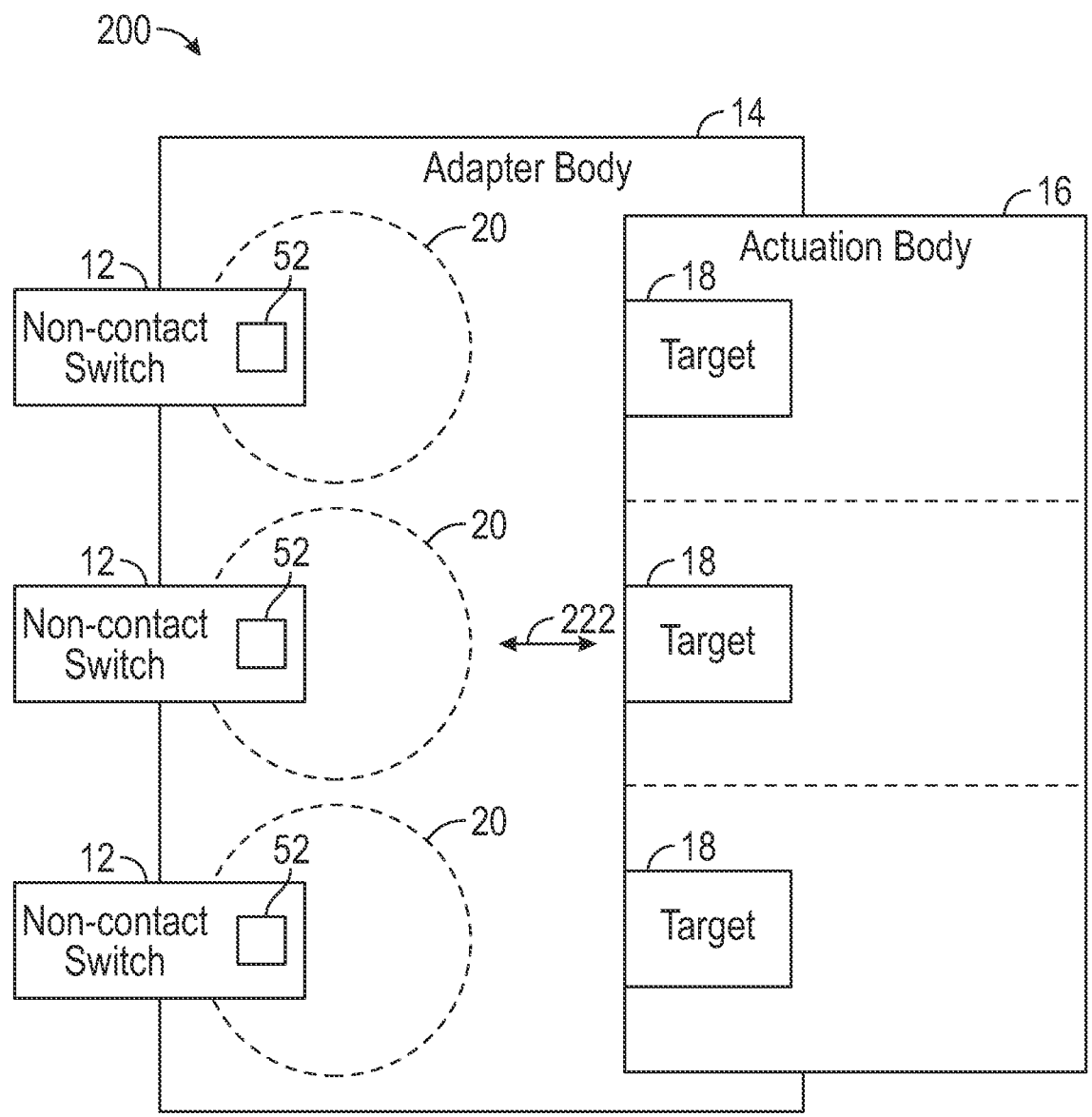
FIG. 11 is a schematic illustration of a switch assembly including a plurality of non-contact switches and a plurality of targets.

In some embodiments, a plurality of switches (e.g., with a corresponding plurality of separate housings) can be configured to be activated by a plurality of targets (e.g., respectively) that are supported on one or more actuation bodies. For example, FIG. 11 illustrates a switch assembly 200 that includes a plurality of non-contact switches 12 coupled to and supported by an adapter body 14. In the illustrated embodiment, the adapter body 14 supports an actuation body 16 and the actuation body 16 supports a plurality of targets 18. Accordingly, the motion or orientation of the actuation body 16 (e.g., as illustrated by arrows 222) can collectively move the plurality of targets 18 to selectively activate one or more of the plurality of non-contact switches 12. For example, as illustrated in FIG. 11, the actuation body 16 is movable relative to the adapter body 14 and the plurality of non-contact switches 12 (e.g., as illustrated by arrows 222) to collectively move the targets 18 to selectively activate the magnetic assembly 52 enclosed within each of the plurality of non-contact switches 12. In some embodiments, the actuation body 16 can be formed from multiple separately movable bodies, including as indicated, for example, by dotted lines in FIG. 11. Thus, in some embodiments, movement of different particular components relative to a common adapter body 14 can selectively activate corresponding particular non-contact switches.

Figure 12:
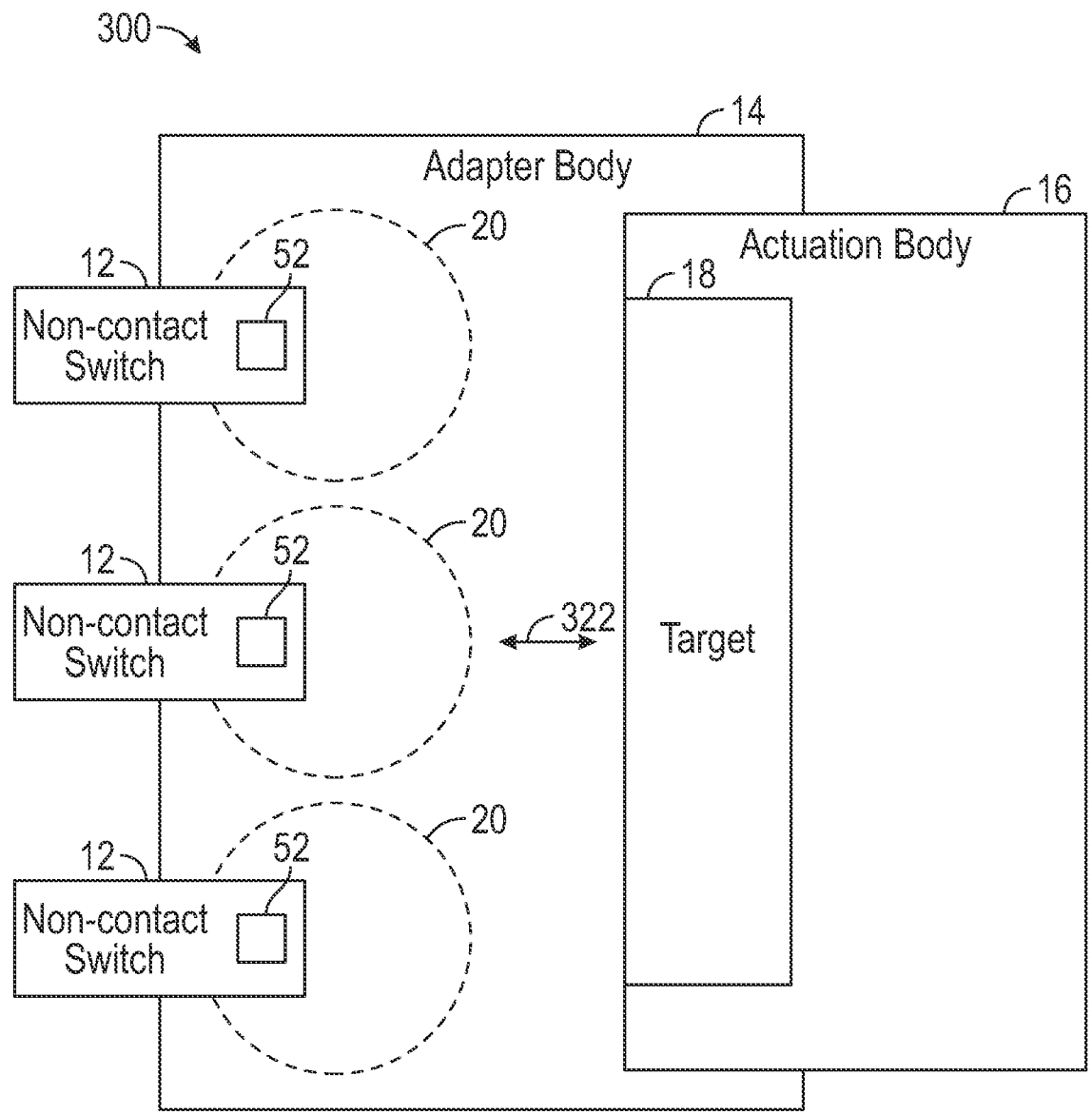
FIG. 12 is a schematic illustration of a switch assembly including a plurality of non-contact switches and a target configured to selectively activate one or more of the plurality of non-contact switches.

In some embodiments, a plurality of switches (e.g., with a corresponding plurality of separate housings) can be configured to be activated by a single target that is supported on an actuation body. For example, FIG. 12 illustrates a switch assembly 300 including a plurality of non-contact switches 12 that are coupled to and supported by an adapter body 14. In the illustrated embodiment, the adapter body 14 supports an actuation body 16 that includes a target 18 configured to simultaneously activate one or more of the plurality of non-contact switches 12. For example, the target 18 can be sized sufficiently such that, when the actuation body 16 is moved within a sensing region 20 of multiple non-contact switches 12, the target 18 can selectively and simultaneously activate a plurality (e.g., all) of the magnetic assemblies 52 enclosed within the non-contact switches 12.

As previously noted herein, some of the disclosed switch assemblies can generally be utilized to adapt a non-contact switch into a mechanically triggered switch, such that the internal electrical state of the non-contact switch can be triggered by an event (e.g., a proximity event), that causes mechanical contact with an object or surface. Thus, for example, some embodiments can allow a non-contact switch to be converted into a contact switch assembly, or can allow non-contact internal switch equipment (e.g., internal switch circuits) to be adapted for contact-based triggering. Correspondingly, the non-contact switches 12 previously described herein (e.g., a magnetic switch) are configured to operate as a switch that is triggered without requiring mechanical contact, independently of the actuation bodies 16 or adapter bodies 14, but can generally be adapted under various embodiments for contact-based operation. For example, a magnetic switch can operate as a proximity type sensor on its own, and utilizing the systems and methods herein, can also be retrofit or adapted to operate as a contact switch (e.g., a limit switch). Similarly, non-contact circuitry or other components can be adapted under some embodiments for use with a non-retrofit contact sensor.

In some implementations, devices or systems disclosed herein can be utilized, manufactured, or installed using methods embodying aspects of the invention. Correspondingly, any description herein of particular features, capabilities, or intended purposes of a device or system is generally intended to include disclosure of a method of using such devices for the intended purposes, of a method of otherwise implementing such capabilities, of a method of manufacturing relevant components of such a device or system (or the device or system as a whole), and of a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

In this regard, for example, some embodiments include a method of converting a switch assembly from a non-contact switch assembly to a contact switch assembly to detect an event. In the following description, reference will be made to FIG. 1, however, it is to be understood that the following description also generally applies to the various other embodiments described herein.

With specific reference to FIG. 1, the adapter body 14 can be secured external to a housing of the pre-existing non-contact switch 12 (e.g., a housing 24) that is desired to be converted to perform the function of a contact switch. The actuation body 16 can be connected to and supported by the adapter body 14, such that the target 18 connected to the actuation body 16 is supported externally to the housing of the non-contact switch 12 by the adapter body 14 and by the actuation body 16. The actuation body 16 can then be disposed to be moved relative to the adapter body 14 (and, subsequently, the non-contact switch 12 itself). Upon the occurrence of a proximity event, the actuation body 16 can be moved from a first orientation to second orientation (e.g., by contact with an external object), to thereby move the target 18 from a first location to a second location. The target 18 can accordingly selectively activate the switch assembly 10 from outside the housing of the non-contact switch 12, based on the position of the actuation body 16 (e.g., depending on whether aligned within the sensing region 20 of the non-contact switch 12). According to some embodiments, the housing 24 of the non-contact switch 12 can be inserted or installed onto a base (e.g., base 30 of FIG. 2) for securement to a surface or system.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A switch assembly for detecting a state of a system, the switch assembly comprising:
   an enclosed housing that encloses a magnetic assembly, the enclosed housing being a sealed housing without ingress points for activation of the magnetic assembly, and the magnetic assembly being configured to be selectively activated to move the switch assembly between a first state and a second state;
   an adapter body that is secured to the enclosed housing, external to the enclosed housing; and
   an actuation body that is movably supported by the adapter body and supports a target external to the enclosed housing, the target being at least one of a magnetic target or a ferrous target;
   the actuation body being movable relative to the adapter body and the enclosed housing, between a first orientation and second orientation, to move the target, respectively, between a first location in which the target activates the magnetic assembly and a second location in which the target does not activate the magnetic assembly.

2. The switch assembly of claim 1, wherein the enclosed housing and the magnetic assembly are configured to operate as a magnetic switch, independently of the adapter body and the actuation body; and
   wherein the adapter body is configured as part of a retrofit assembly for the magnetic switch.

3. The switch assembly of claim 1, wherein the enclosed housing includes a threaded portion; and
   wherein the adapter body is configured to be threadedly secured to the threaded portion.

4. The switch assembly of claim 1, further comprising:
   a biasing element configured to bias the actuation body toward one of the first or second orientations.

5. The switch assembly of claim 1, wherein the actuation body is a lever arm that is pivotably secured to the adapter body.

6. The switch assembly of claim 1, wherein the actuation body is a push-button.

7. The switch assembly of claim 1, wherein the target is a first target of a plurality of targets supported by the actuation body;

wherein the enclosed housing is a first enclosed housing of a plurality of enclosed housings, each with a magnetic assembly configured to be selectively activated; and wherein the actuation body is movable relative to the adapter body and the plurality of enclosed housings to collectively move the targets to selectively activate the magnetic assemblies.

8. The switch assembly of claim 1, wherein the magnetic assembly is part of one or more of:
   a single pole double throw switch;
   a double pole double throw switch;
   a single pole single throw switch; or
   a double pole single throw switch.

9. The switch assembly of claim 1, wherein the enclosed housing includes a round housing profile to which the adapter body is secured.

\* \* \* \* \*